United States Patent
Templeton

(10) Patent No.: US 6,830,389 B2
(45) Date of Patent: Dec. 14, 2004

(54) PARALLEL PLATE DEVELOPMENT WITH THE APPLICATION OF A DIFFERENTIAL VOLTAGE

(75) Inventor: Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 641 days.

(21) Appl. No.: 09/973,034

(22) Filed: Oct. 9, 2001

(65) Prior Publication Data
US 2002/0046703 A1 Apr. 25, 2002

Related U.S. Application Data

(60) Provisional application No. 60/243,080, filed on Oct. 25, 2000.

(51) Int. Cl.[7] .............................. G03B 5/00; G03B 5/04; B05C 11/00; B05C 13/00; B05D 3/12
(52) U.S. Cl. ..................... 396/611; 396/571; 396/627; 118/52; 118/500; 427/240
(58) Field of Search ................................ 396/571, 611, 396/626, 627; 118/52, 500; 134/902; 427/240

(56) References Cited

U.S. PATENT DOCUMENTS

| | | | | |
|---|---|---|---|---|
| 4,021,278 A | * | 5/1977 | Hood et al. ..................... 438/8 |
| 4,373,991 A | * | 2/1983 | Banks ........................... 451/28 |
| 4,544,446 A | * | 10/1985 | Cady ............................ 438/689 |
| 4,922,277 A | * | 5/1990 | Carlson et al. ............... 396/609 |
| 5,275,690 A | * | 1/1994 | Garwood, Jr. ................ 216/92 |
| 6,076,979 A | * | 6/2000 | Mimasaka et al. ........... 396/604 |
| 6,190,063 B1 | * | 2/2001 | Akimoto ....................... 396/611 |
| 6,241,403 B1 | * | 6/2001 | Sakamoto et al. ............ 396/611 |
| 6,458,607 B1 | * | 10/2002 | Rangarajan et al. ........... 438/14 |

* cited by examiner

*Primary Examiner*—Alan Mathews
(74) *Attorney, Agent, or Firm*—Amin & Turocy, LLP

(57) ABSTRACT

A system and method is provided for applying a developer to a photoresist material layer disposed on a semiconductor substrate. The developer system and method employ a developer plate having a plurality of a apertures for dispensing developer. Preferably, the developer plate has a bottom surface with a shape that is similar to the wafer. The developer plate is disposed above the wafer and substantially and/or completely surrounds the top surface of the wafer during application of the developer. A small gap is formed between the wafer and the bottom surface of the developer plate. The wafer and the developer plate form a parallel plate pair, such that the gap can be made small enough so that the developer fluid quickly fills the gap. A differential voltage is applied to the developer plate and the wafer causing an electric field to be formed in the gap. Transportation of negatively charge photoresist material is facilitated by exposure to the electric field during the development process.

28 Claims, 9 Drawing Sheets

PARALLEL PLATE DEVELOPMENT WITH THE APPLICATION OF A DIFFERENTIAL VOLTAGE

CROSS REFERENCE TO RELATED APPLICATION

The present application claims the benefit of U.S. Provisional Patent Application Ser. No. 60/243,080, filed Oct. 25, 2000, entitled PARALLEL PLATE DEVELOPMENT WITH THE APPLICATION OF A DIFFERENTIAL VOLTAGE.

TECHNICAL FIELD

The present invention generally relates to semiconductor processing, and in particular to a system and method for optimal development of a photoresist material layer on a wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon structure is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than ±10–20 Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer.

After the resist is spin coated and selectively irradiated to define a predetermined pattern, the irradiated or nonirradiated portions are removed by applying a developer material. The developer material is also spin coated onto the wafer by applying developer material across the resist and then spin coating the developer material until centrifugal forces disperse the developer material over the coating of resist. Due to the surface of the photoresist material layer on the semiconductor being highly hydrophobic, the surface can repel the developer material at the initial state of jetting out the developer material from the developer supply nozzle so that turbulent flow of the developer material is generated on the surface of the resist forming bubbles. The bubbles produced between the photoresist material layer and the developer material are a cause of defects in the resist pattern. Additionally, due to the developer being spincoated along a central point of the photoresist, the developer is not always uniformly applied across the photoresist material. This non-uniform distribution of developer can result in semiconductor defects.

Moreover, non-uniform distribution of developer causes problems related to critical dimension (CD) control. In particular, non-uniform distribution of developer across the photoresist means that substrates (typically, wafers or masks) have locations of different CD control. One must therefore consider these differences when attempting to optimize CD control, thereby compromising CD control quality in certain areas of the substrate.

After the photoresist material layer has been developed, the irradiated or nonirradiated portions are removed by rinsing or washing with a washing solution material. Each time a photoresist material layer is to be developed, a developer nozzle moves to the center of the photoresist material layer and applies the developer material. The developer nozzle then moves to the rest position and a washing solution nozzle moves above the wafer to rinse the developed portions and the developer material off the photoresist material layer. This constant movement of the different nozzles not only takes up a great deal of time, but eventually leads to mechanical problems and increased maintenance.

A prior art developer nozzle and washing solution application system is illustrated in FIGS. 1a–1b. A multiple tip developer nozzle 10 is coupled to a pivotable arm 12 that pivots from a rest position to an operating position. In the operating position, the multiple tip nozzle 10 applies a developer material 26 on a resist layer 24 disposed on a wafer 22. The wafer 22 is vacuum held onto a rotating chuck 20 driven by a shaft 18 coupled to a motor 16. The developer material flows outward from the center of the photoresist material layer 24 covering the entire top surface of the photoresist material layer 24. A washing solution nozzle 28 is coupled to an arm 32 and moves from an operating position to a rest position. The washing solution nozzle provides a washing solution material 30 to rinse the developed photoresist and the developer material from the photoresist material layer 24. As illustrated in FIG. 1a, the washing solution nozzle 28 is typically at a much greater distance from the photoresist material layer in its operating state than the developer nozzle is when it is in its operating state resulting in a splashing effect that can scatter particles and cause defects.

In view of the above, there is an unmet need for a system/method for dispensing a uniform layer of developer across a photoresist material layer formed on a wafer. There is also and unmet need for a system/method that provides a rinse that mitigates splashback during rinsing of the developed photoresist and developer material from a photoresist material layer.

SUMMARY OF THE INVENTION

The present invention provides a system and method of applying a developer to a photoresist material layer disposed on a semiconductor substrate. The developer system and method employ a developer plate having a plurality of apertures for dispensing developer. Preferably, the developer plate has a bottom surface with a shape that is similar to the wafer. The developer plate is disposed above the wafer and substantially and/or completely surrounds the top surface of the wafer during application of the developer. A small gap is formed between the wafer and the bottom surface of the developer plate. A small gap is defined as a gap having a size from about 0.5 to about 5 mm. The wafer and the developer plate form a parallel plate pair, such that the gap can be made small enough so that the developer fluid quickly fills the gap. The developer plate is disposed in very close proximity with respect to the wafer, such that the developer is squeezed between the two plates thereby spreading evenly the developer over the wafer. Preferably, the developer plate and the wafer are rotated in the same direction at the same speed or frequency so that the amount of agitation can be controlled to strictly a radial mode. Alternatively, the developer plate and the wafer can be rotated in the same direction at different speeds and frequencies to increase the agitation of the developer. Furthermore, the developer plate and the wafer can be rotated in different directions at the same or different speeds and frequencies to increase the agitation of the developer.

Moreover, the proximity of the developer plate to the wafer during application and the size of a plurality of apertures in the developer plate provides for improved localization with respect to development of the photoresist material layer. Since very little surface area of the photoresist material layer is exposed, evaporation rates can be minimized with respect to conventional development, thus improving temperature control. Additional improvements in temperature control can be obtained by heating the developer plate. In one aspect of the invention, the developer plate is also provided with a washing or rinsing solution for washing or rinsing the developed photoresist from the wafer. The developer plate can include separate apertures and supply mechanisms for supplying the washing solution to isolate the developer from the washing solution. Since the wafer is covered during spin rinsing, splashback effects are minimized.

Another aspect of the invention relates to providing a differential voltage across the developer plate and a wafer or a wafer support (e.g., a wafer chuck). The differential voltage causes the photoresist resin material to retain a negative charge. During the development process, irradiated or nonirradiated portions of the photoresist are developed. An electric field generated by the differential voltage facilitates transport of the negatively charged developed resin material out of small areas and voids, so that undeveloped portions of the photoresist resin selected for development may be exposed to the developer material. Therefore, improved development of the entire photoresist layer is the result.

One aspect of improved localization with respect to development of the photoresist material layer involves better CD control. Improved CD control is obtainable employing the present invention since the developer is dispensed and spread relatively equally over the photoresist surface. That is, substantially the same CD control is achieved at various locations across the photoresist surface.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
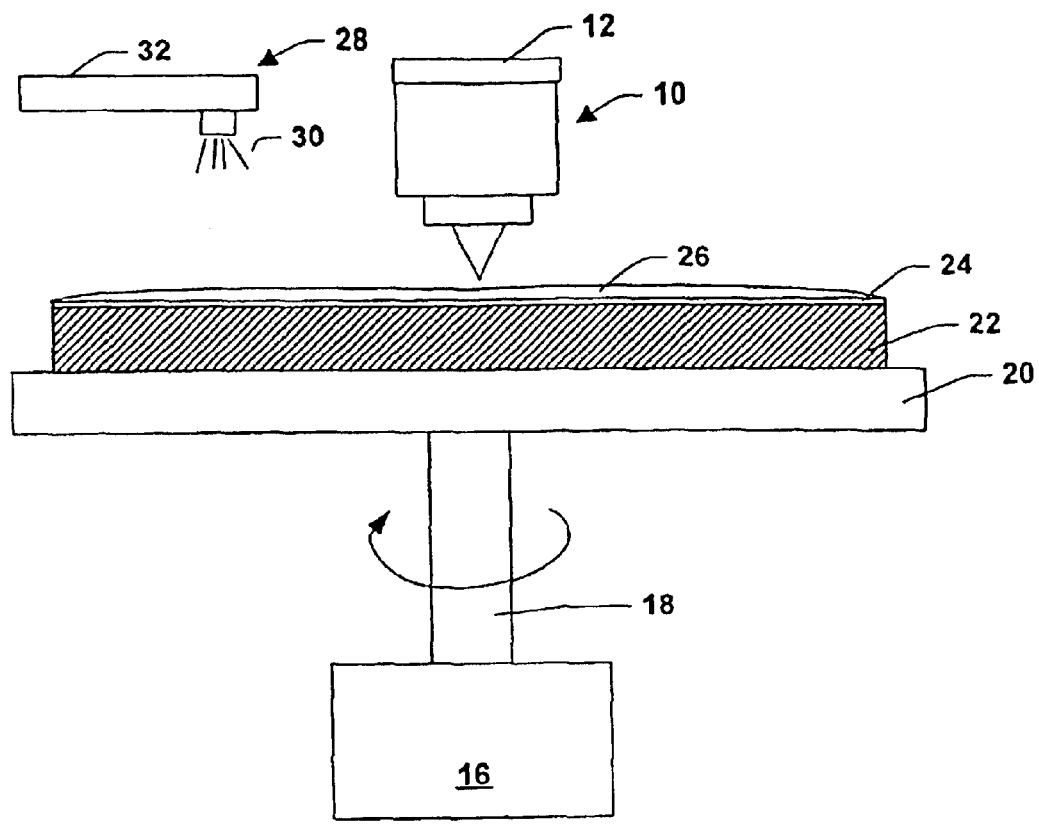
FIG. 1a illustrates a front view of a developer material and washing solution material application system in accordance with the prior art.
Figure 1B:
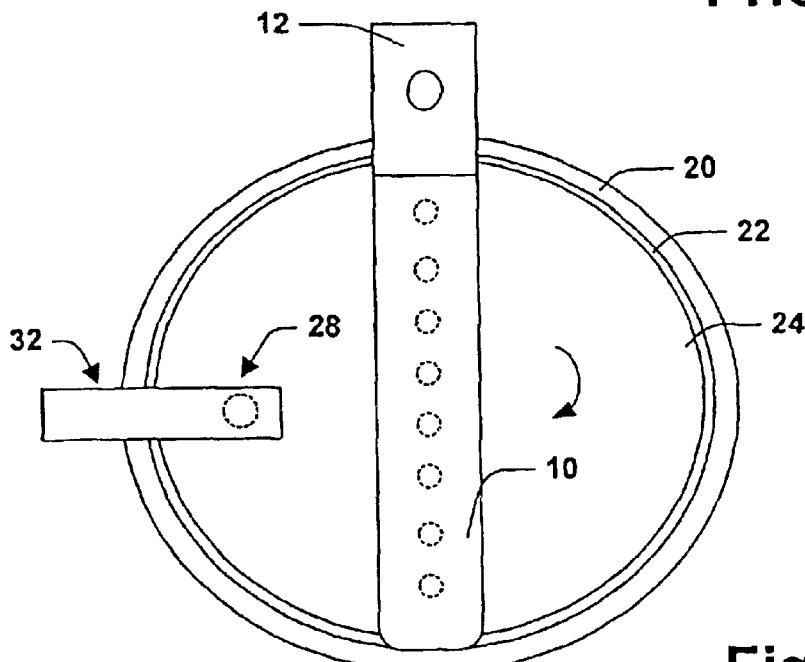
FIG. 1b illustrates a top view of the developer material and washing solution material application system illustrated in FIG. 1a in accordance with the prior art.

The present invention will now be described with reference to the drawings, wherein like reference numerals are used to refer to like elements throughout. The present invention will be described with reference to a system and method of applying a developer to a photoresist material layer disposed on a semiconductor substrate. The system and method employ a developer plate having a plurality of apertures for dispensing developer. The developer plate is disposed in close proximity to the photoresist material layer during application and the developer plate and the substrate form a parallel plate pair. The developer plate remains engaged with the photoresist material layer during the development process mitigating any waste of developer and maximizing development efficiency. Therefore, less developer is required to develop a photoresist material layer. A differential voltage is applied across the developer plate and wafer facilitating the development process. It should be understood that the description of these embodiments are merely illustrative and that they should not be taken in a limiting sense.

Figure 2A:
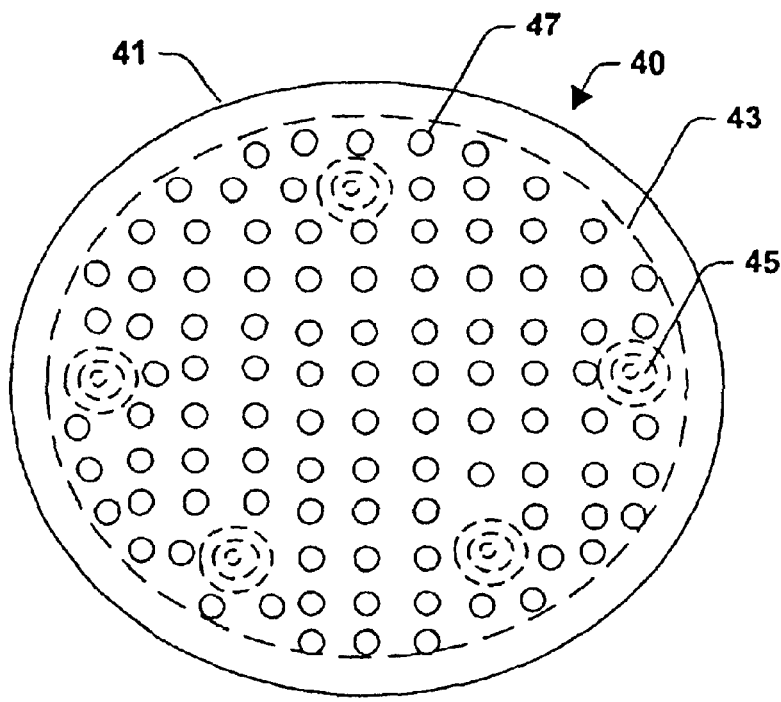
FIG. 2a illustrates a bottom view of a development system in accordance with the present invention.
Figure 2B:
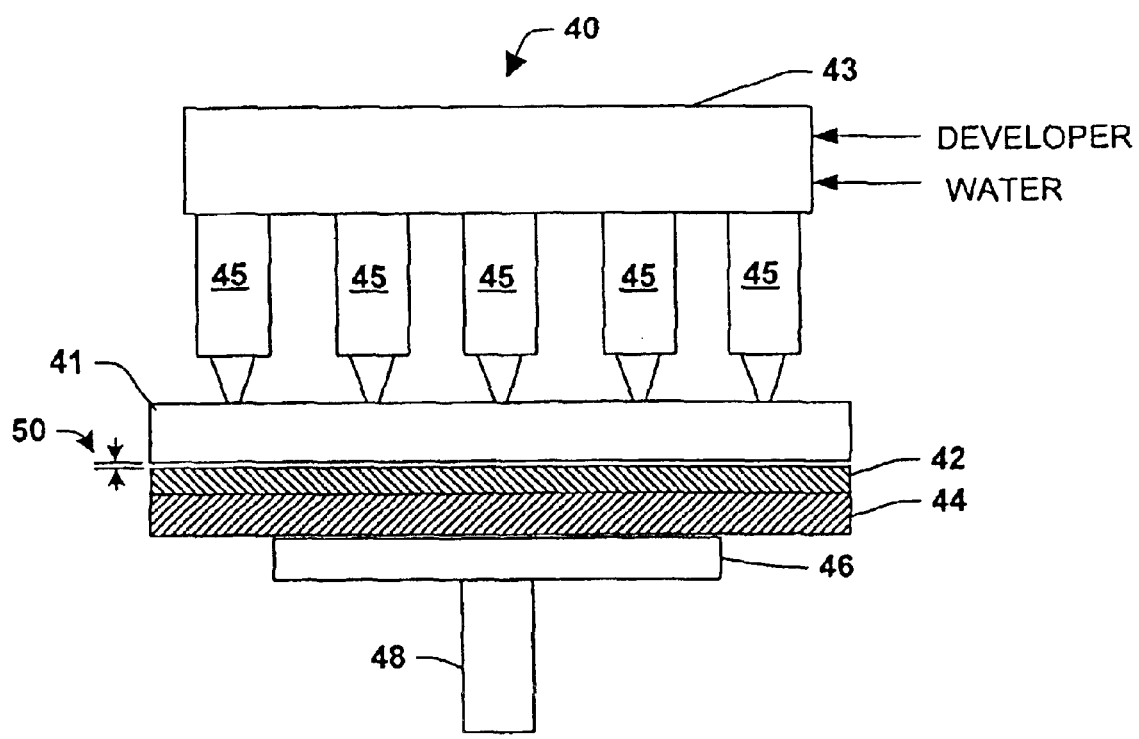
FIG. 2b illustrates a side view of the development system of FIG. 2a in accordance with the present invention.

FIGS. 2a and 2b illustrate a development application system 40. The development application system 40 includes a developer supply system 43, a plurality of supply nozzle assemblies 45 and a parallel developer plate 41. The parallel developer plate 41 includes a plurality of apertures 47 extending therethrough for applying a developer to a photoresist material 42 that has been spin coated onto a wafer 44. The wafer 44 is vacuum held onto a rotating chuck 46. The wafer 44 is spin rotated by a shaft 48 driven by a motor (not shown), so that a photoresist material can be applied to the wafer 44 to form a uniform film or layer of photoresist material 42 over the wafer 44. After the photoresist material is baked and/or dried, suitable photolithographic techniques (e.g., irradiation, development ) may be performed to form a patterned photoresist material layer.

The developer plate 41 forms a parallel plate pair with the wafer 44 during application of the developer. The developer supply system 43 can be provided with a supply of concentrated developer (not shown) and can be provided with a supply of water (not shown) for allowing variation of the concentration of the developer. The supply nozzles provide the developer plate 41 with a volume of developer for application to the patterned photoresist material layer 42. The developer plate 41 can include an on/off shut off plate (not shown) or the like therein for controlling the application of the developer. The on/off shut off plate allows for the developer to be evenly spread throughout the developer plate 41 prior to applying the developer to the photoresist material layer 42. The developer plate 41 is disposed in very close proximity with respect to the wafer 44, such that the developer is squeezed between the two plates (i.e., the developer plate 41 and the wafer 44) thereby spreading evenly the developer over the wafer. Typically, a gap 50 between the developer plate 41 and the wafer 44 is from about 0.5 to about 5 mm. In another aspect of the invention, the gap 50 is from about 1 to 3 mm. Preferably, the gap 50 is about 2 mm. Since the developer film is stagnant, less splashing occurs and a more uniform development of the wafer is the results. Furthermore, the proximity of the developer plate 41 to the wafer 44 during application and the size of the plurality of apertures provides for improved localization with respect to development of the photoresist material layer 42. In this connection, improved CD control is achievable; and in particular, CD control is uniform across the wafer.

Figure 3A:
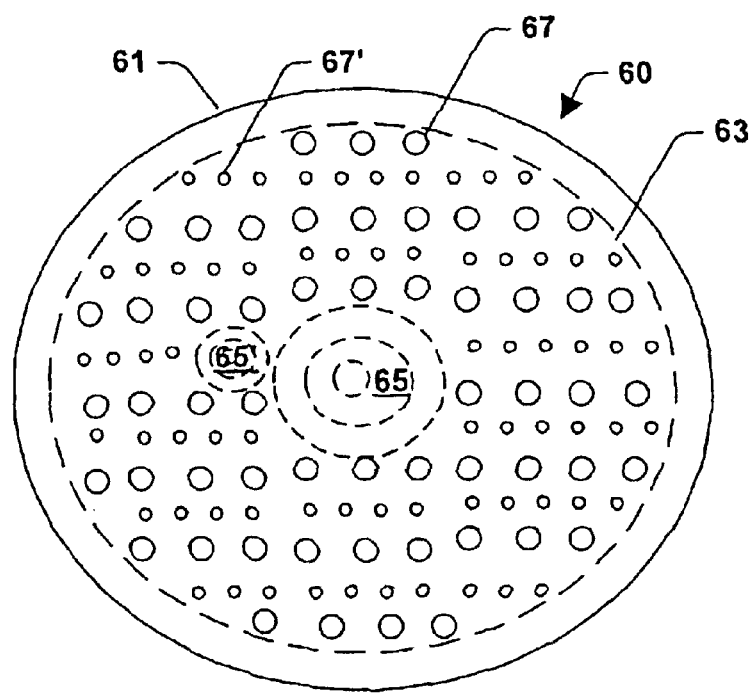
FIG. 3a illustrates a bottom view of a development system in accordance with the present invention.
Figure 3B:
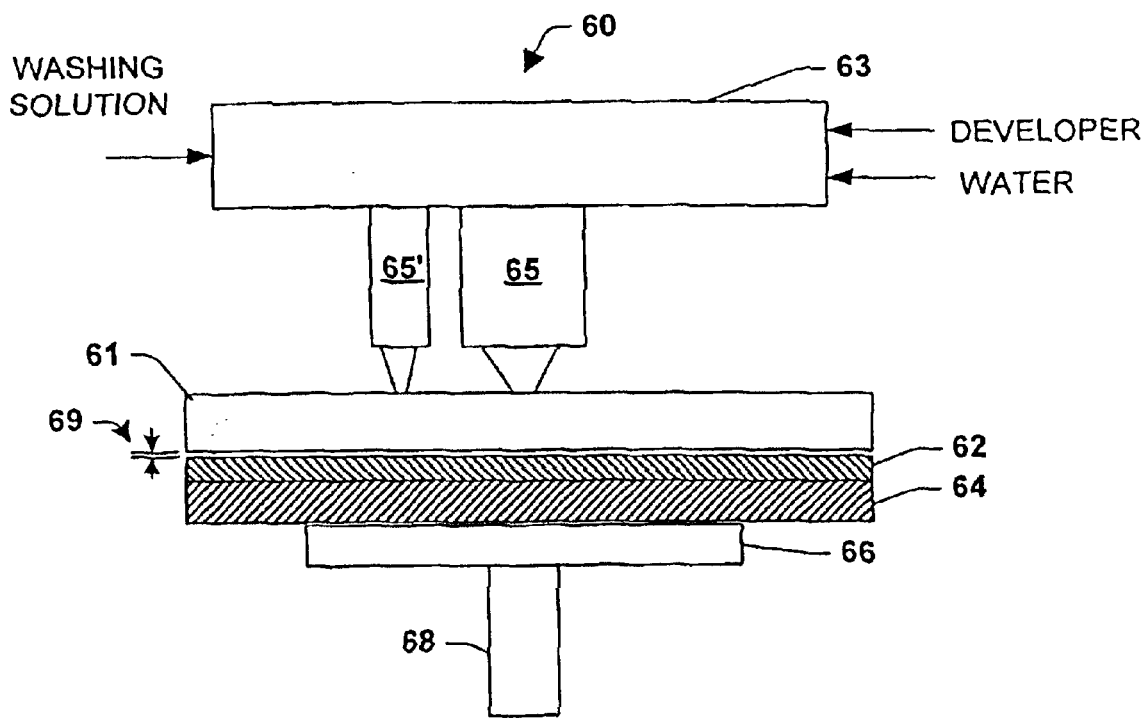
FIG. 3b illustrates a side view of the development system of FIG. 3a in accordance with the present invention.

FIGS. 3a and 3b illustrate an alternate development application system 60. The development application system 60 includes a developer supply system 63, a single central developer supply nozzle 65, a washing solution supply nozzle 65' and a parallel developer plate 61. The parallel developer plate 61 includes a plurality of apertures 67 extending therethrough for applying a developer to a photoresist material 62 that has been spin coated onto a wafer 64. The developer plate 61 also includes a plurality of apertures 67' for applying a washing solution to the photoresist material 62 after the material is developed by the developer. The developer apertures 67 and the washing solution apertures 67' are isolated by one another through a series of chambers (not shown).

The developer plate 61 forms a parallel plate pair with the wafer 64 during application of the developer and/or washing solution. The developer supply system 63 is provided with a supply of concentrated developer (not shown) and a supply of water (not shown) for allowing variation of the concentration of the developer. The nozzles provide the developer plate 61 with a volume of developer for application to the patterned photoresist material layer 62. The developer plate 61 is disposed in very close proximity with respect to the wafer 64, such that the developer is squeezed between the two plates (i.e., the developer plate 61 and the wafer 64) thereby spreading evenly the developer over the wafer. Preferably, a gap 69 between the developer plate 61 and the wafer 64 is about 2 mm. The use of a single central nozzle provides for easier implementations of heat lamps or the like for heating the developer plate 61. The washing solution nozzle 65' is supplied with a supply of washing solution (not shown). Splashback effects are prevented due to the close proximity of the plate 61 to the photoresist material 62.

Figure 4:
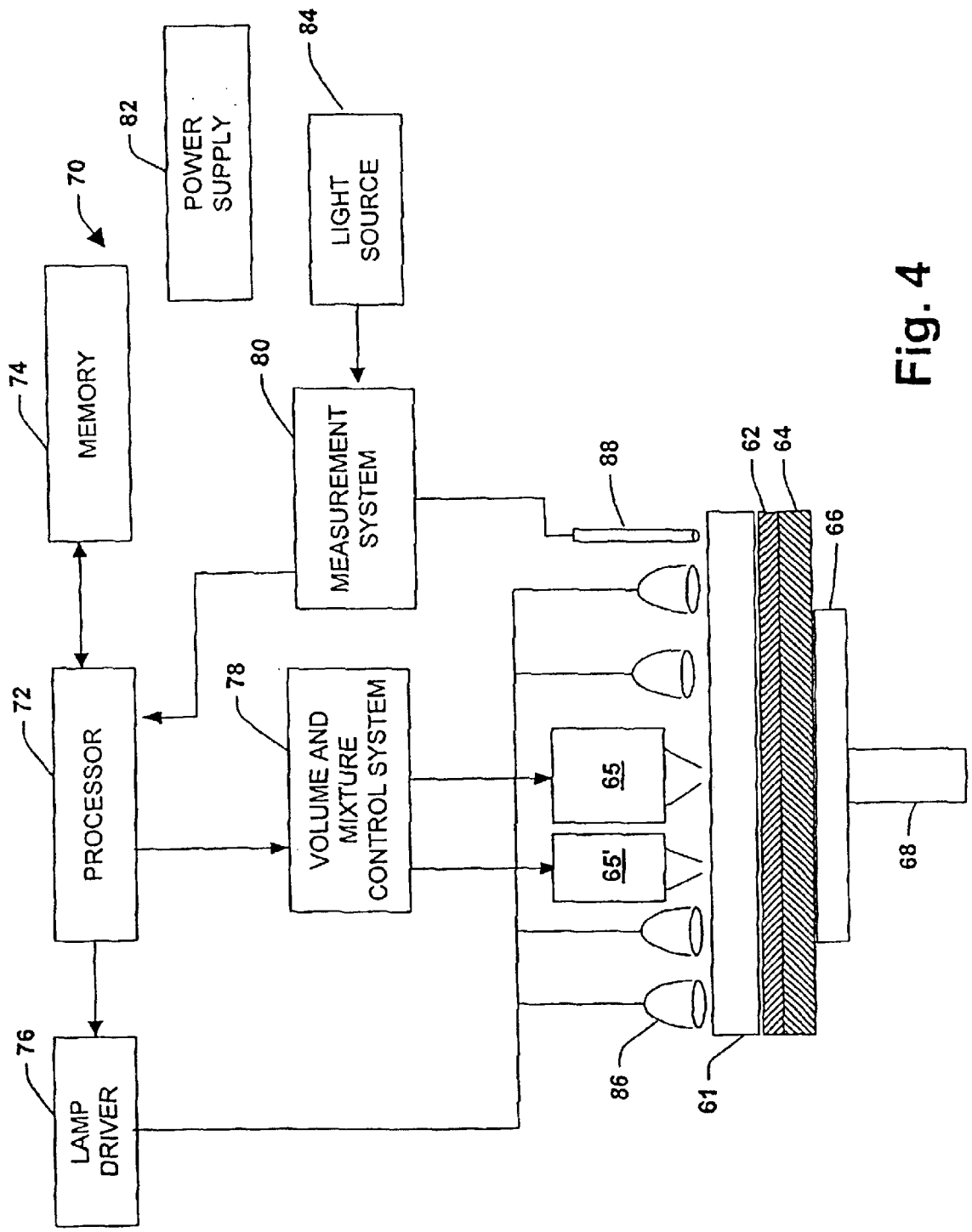
FIG. 4 is a representative schematic block diagram of a heating and monitoring system in accordance with one particular aspect of the present invention.

Referring initially to FIG. 4, a system 70 for heating substantially uniformly the developer plate 61 is shown. The system 70 includes a plurality of heat lamps 86 which are selectively controlled by the system 70 so as to facilitate uniform heating of the developer plate 61. At least one optical fiber 88 projects radiation onto a portion of the developer plate 61. Radiation reflected from the developer plate 61 is processed by a temperature measuring system 80 to measure at least one parameter relating to the temperature of the developer plate 61. The reflected radiation is processed with respect to the incident radiation in measuring the temperature.

The measuring system 80 can include an interferometry system or a spectrometry system. It is to be appreciated that any suitable interferometry system and/or spectrometry system may be employed to carry out the present invention and such systems are intended to fall within the scope of the hereto appended claims. Interferometry systems and spectrometry systems are well known in the art, and therefore further discussion related thereto is omitted for sake of brevity.

A light source 84 of monochromatic radiation such as a laser provides radiation to the at least one optical fibers 88 via the measuring system 80. Preferably, the radiation source 84 is a frequency stabilized laser however it will be appreciated that any laser or other radiation source (e.g., laser diode or helium neon (HeNe) gas laser) suitable for carrying out the present invention may be employed.

A processor 72 receives the measured data from the measuring system 80 and determines the temperature of the developer plate 61. The processor 72 is operatively coupled to system 70 and is programmed to control and operate the various components within the developer system 70 in order to carry out the various functions described herein. The manner in which the processor 72 can be programmed to carry out the functions relating to the present invention will be readily apparent to those having ordinary skill in the art based on the description provided herein.

A memory 74 which is operatively coupled to the processor 72 is also included in the system 70 and serves to store program code executed by the processor 72 for carrying out operating functions of the system 70 as described herein. The memory 74 includes read only memory (ROM) and random access memory (RAM). The ROM contains among other code the Basic Input-Output System (BIOS) which controls the basic hardware operations of the system 70. The RAM is the main memory into which the operating system and application programs are loaded. The memory 74 also serves as a storage medium for temporarily storing information such as developer plate temperature, temperature tables, interferometry information, spectrometry information and other data which may be employed in carrying out the present invention. For mass data storage, the memory 74 may include a hard disk drive (e.g., 10 Gigabyte hard drive).

Power supply 82 provides operating power to the system 70. Any suitable power supply (e.g., battery, line power) may be employed to carry out the present invention.

The processor 72 is also coupled to a volume and mixture control system 78. The volume and mixture control system 74 is operatively coupled to the developer nozzle 65, which applies developer to the photoresist material 62 and the washing solution nozzle 65' for rinsing the developed photoresist from the photoresist material layer 62. It is to be appreciated although a single nozzle 65 is illustrated, the developer application system 70 can be employed that implements a plurality of similar nozzles for supplying developer and/or a rinse material to the developer plate 61. The volume and mixture control system 74 can select between supplying developer or a rinse material to rinse the developer from the developed photoresist material 62. The volume and mixture control system 74 can also control the volume of developer and/or rinse material supplied to the developer plate 61.

Figure 5A:
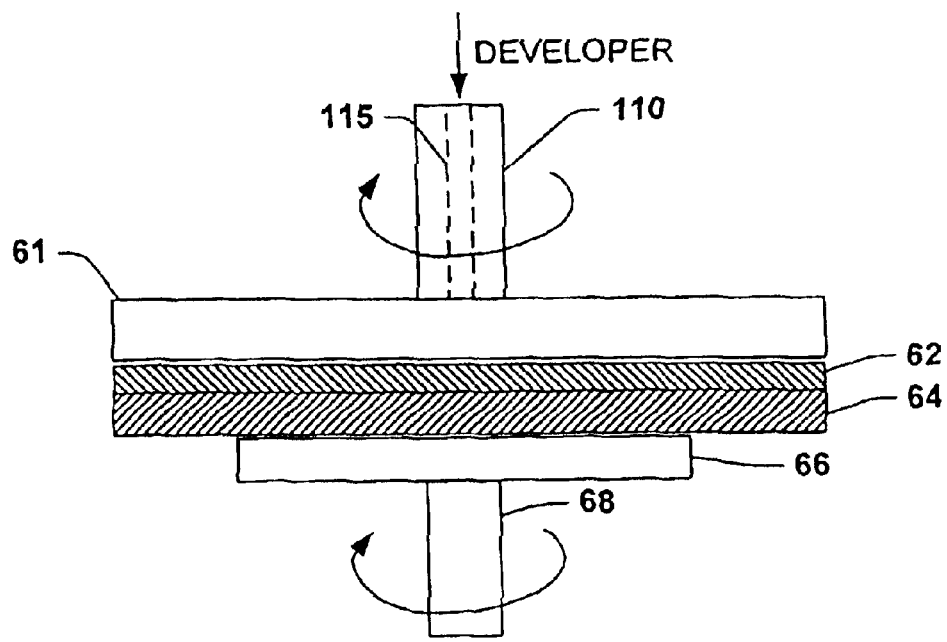
FIG. 5a illustrates a front view of a developer plate and wafer in the same direction in accordance with the present invention.
Figure 5B:
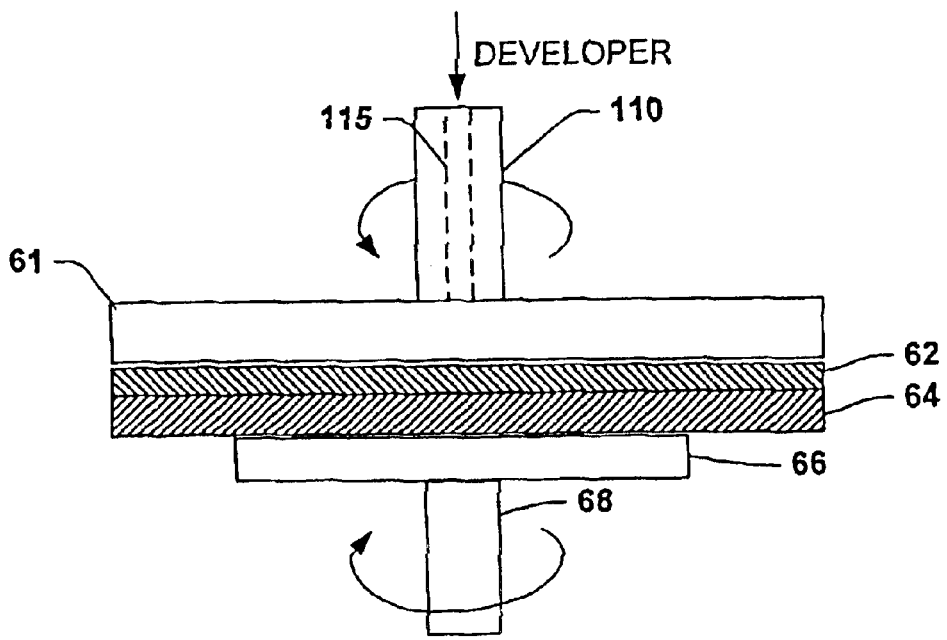
FIG. 5b illustrates a front view of a developer plate and wafer rotating in opposite directions in accordance with the present invention.

FIG. 5a illustrates one particular aspect of the invention with respect to movement of the developer plate 61 and the wafer 64 during application of developer on the photoresist layer 62. A supply of developer (not shown) is provided to a supply tube 115 disposed in a developer rotation shaft 110. In one aspect of the invention, the developer rotation shaft rotates the developer plate 61 in the same direction and at the same frequency or speed as the shaft 68 rotates the wafer 64. This provides for controlling and limiting the agitation of the developer and photoresist material to mostly the radial direction. Alternatively, FIG. 5b illustrates an example where the agitation of the developer and the photresist material is increased by rotating the developer plate 61 in the opposite direction with respect to the wafer 64.

Although the developer plate 61 has been illustrated with respect to a circular surface covering the entire surface of the wafer 64, it is to be appreciated that the size and shape of the surface is not limited to such, various shapes and sizes may be employed as long as the developer plate substantially covers the wafer 64 and that the gap between the developer plate 61 and the wafer 64 remains small. Additionally, although the developer plate 61 has been illustrated with respect to a developer plate 61 with a plurality of uniformly distributed apertures extending therethrough (e.g. a shower head like structure) a variety of aperture patterns may be employed. For example, an aperture pattern resembling a spiral with holes being larger with respect to the center of the developer plate may be employed in a situation where the developer plate remains stationary and the wafer rotates during application of the developer. Other aperture patterns may be employed based on the type and density of the developer and/or resist pattern.

Figure 6A:
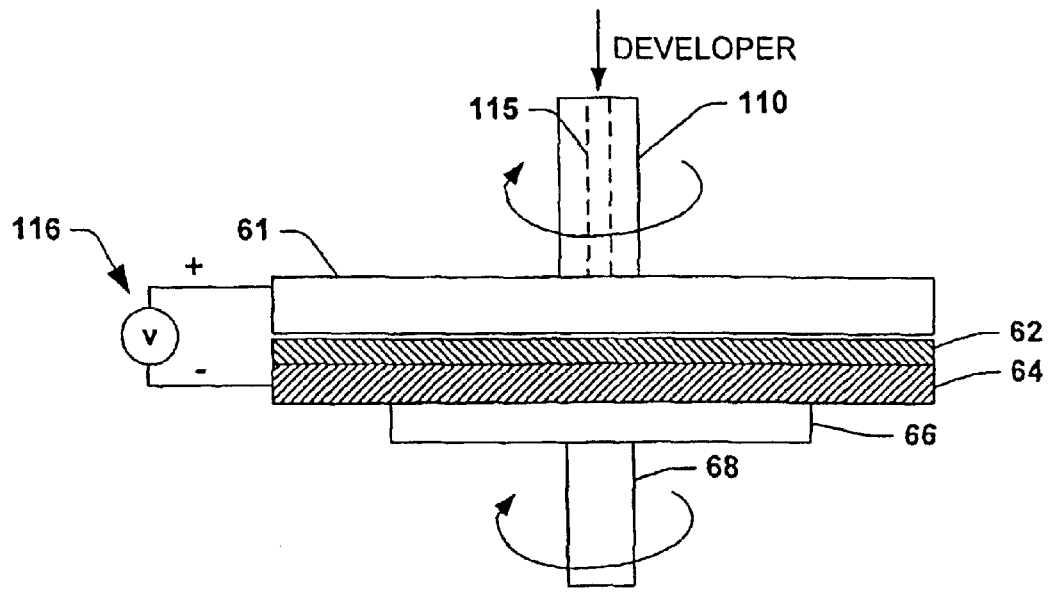
FIG. 6a illustrates a front view of a differential voltage being applied across a developer plate and wafer rotating in the same direction in accordance with the present invention.
Figure 6B:
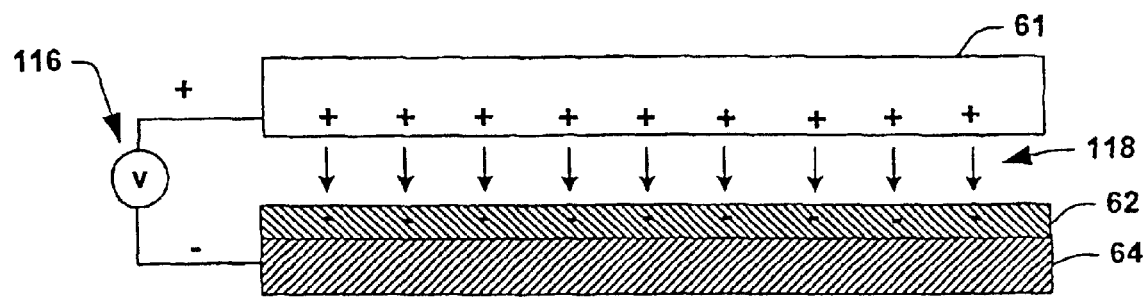
FIG. 6b illustrates a front view of a developer plate and wafer having an electric field therebetween in accordance with the present invention.

FIG. 6a illustrates one particular aspect of the invention with respect to facilitation of the development process by providing a differential voltage across the developer plate 61 and the wafer 64 during application of developer on the photoresist layer 62. A voltage source 116 has a positive terminal coupled to the developer plate 61 and a negative terminal coupled to the wafer 64. Prior to the development process the potential voltage from the developer plate 61 to the wafer 64 causes the photoresist layer 62 to retain a negative charge. Other mechanisms may be provided to negatively charge the photoresist layer. A supply of developer (not shown) is provided to a supply tube 115 disposed in a developer rotation shaft 110. The developer rotation shaft rotates the developer plate 61 as the shaft 68 rotates the wafer 64. This provides for controlling and limiting the agitation of the developer and photoresist material to mostly the radial direction. As illustrated in FIG. 6b, an electric field is provided between the developer plate 61 and the wafer 62 by the differential voltage between the plates. The electric field 118 facilitates transport of the developed portions of the photoresist material, for example, during spinning so that undeveloped portions selected to be developed (e.g., irradiated or nonirradiated portions) can be further exposed to the developer.

Figure 7:
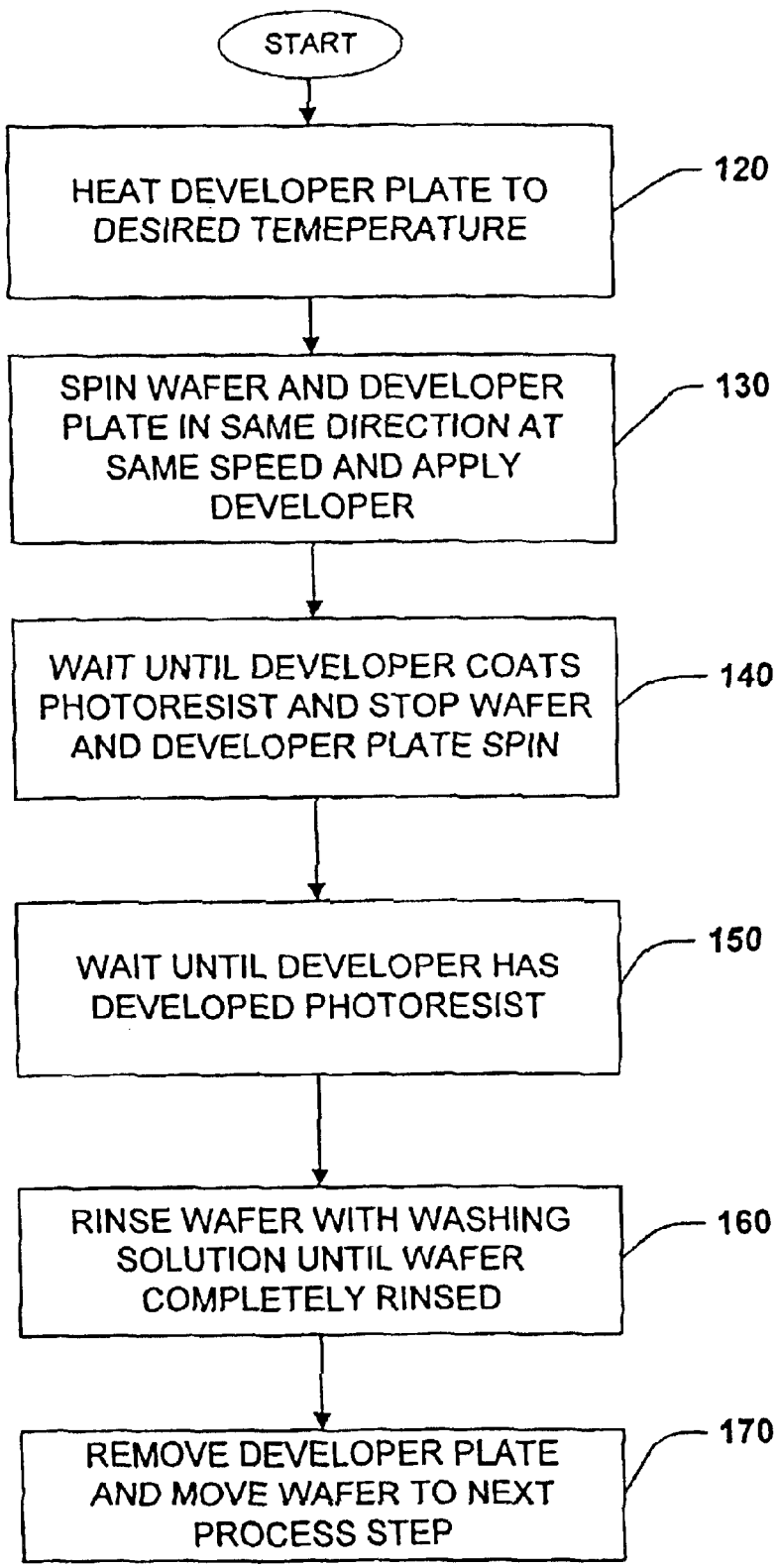
FIG. 7 is a flow diagram illustrating one specific methodology for carrying out a development process in accordance with the present invention.

FIG. 7 is a flow diagram illustrating one particular methodology for carrying out the development process in accordance with the present invention. In step 120, the developer plate 61 is heated to a desired temperature. In step 130, the developer plate 61 and the wafer 64 are spun in the same direction at the same rotational speed and developer is applied. In step 140, the process waits for the developer to coat the photoresist material layer 62 and the developer plate and the wafer 62 are stopped from spinning. In step 150, the process waits for the developer to develop the photoresist material layer 62. The wafer is then rinsed with a washing solution material until the wafer is completely rinsed in step 160. In step 170, the developer plate 61 is moved from the top of the wafer 64 and the wafer 64 is advanced to the next process.

Figure 8:
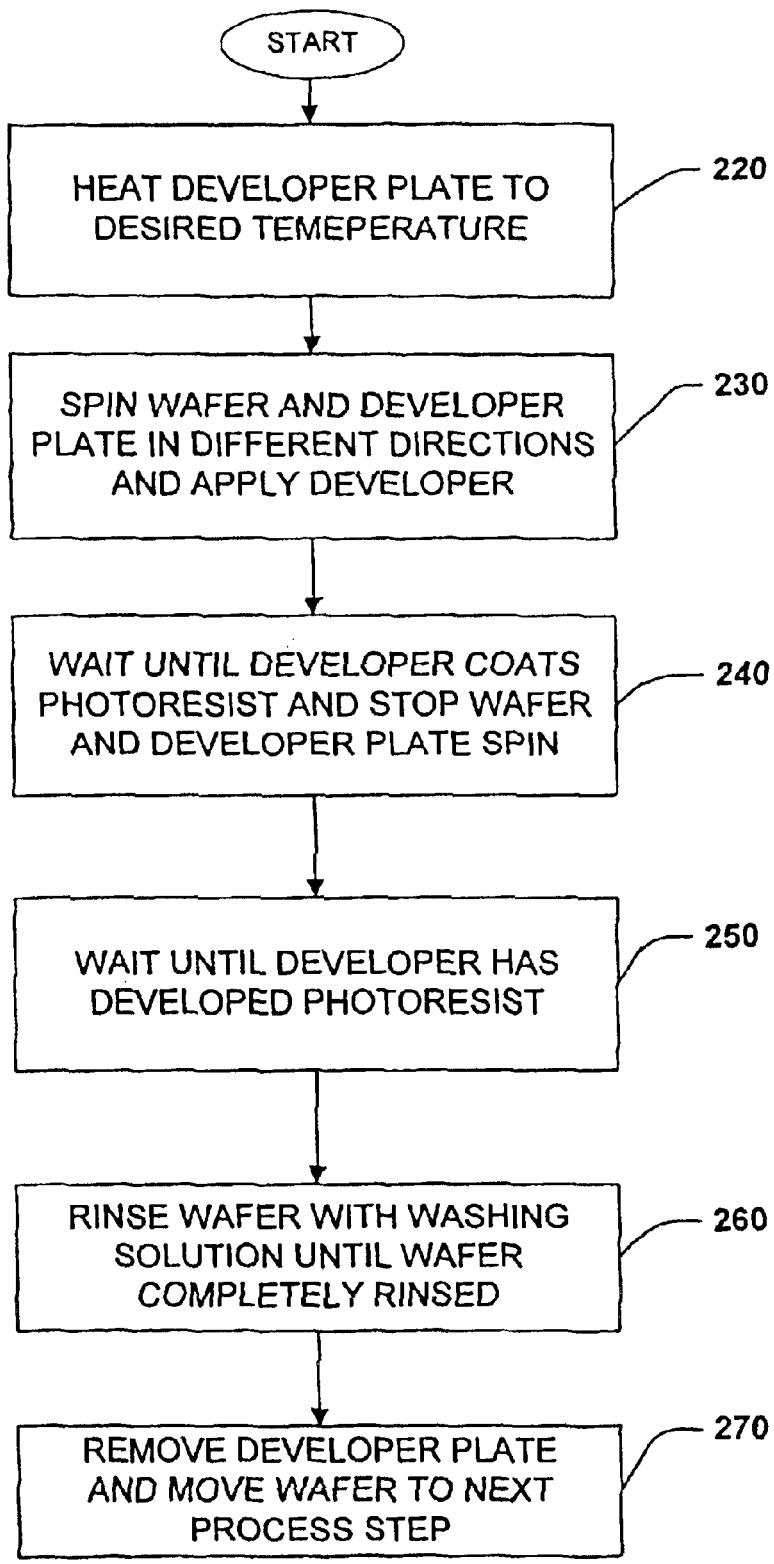
FIG. 8 is a flow diagram illustrating another specific methodology for carrying out a development process in accordance with the present invention.

FIG. 8 is a flow diagram illustrating another methodology for carrying out the development process in accordance with the present invention. In step 220, the developer plate 61 is heated to a desired temperature. In step 230, the developer plate 61 and the wafer 64 are spun in different directions at the same rotational speed and developer is applied. In step 240, the process waits for the developer to coat the photoresist material layer 62 and the developer plate and the wafer 62 are stopped from spinning. In step 250, the process waits for the developer to develop the photoresist material layer 62. The wafer is then rinsed with a washing solution material until the wafer is completely rinsed in step 260. In step 270, the developer plate 61 is moved from the top of the wafer 64 and the wafer 64 is advanced to the next process.

Figure 9:
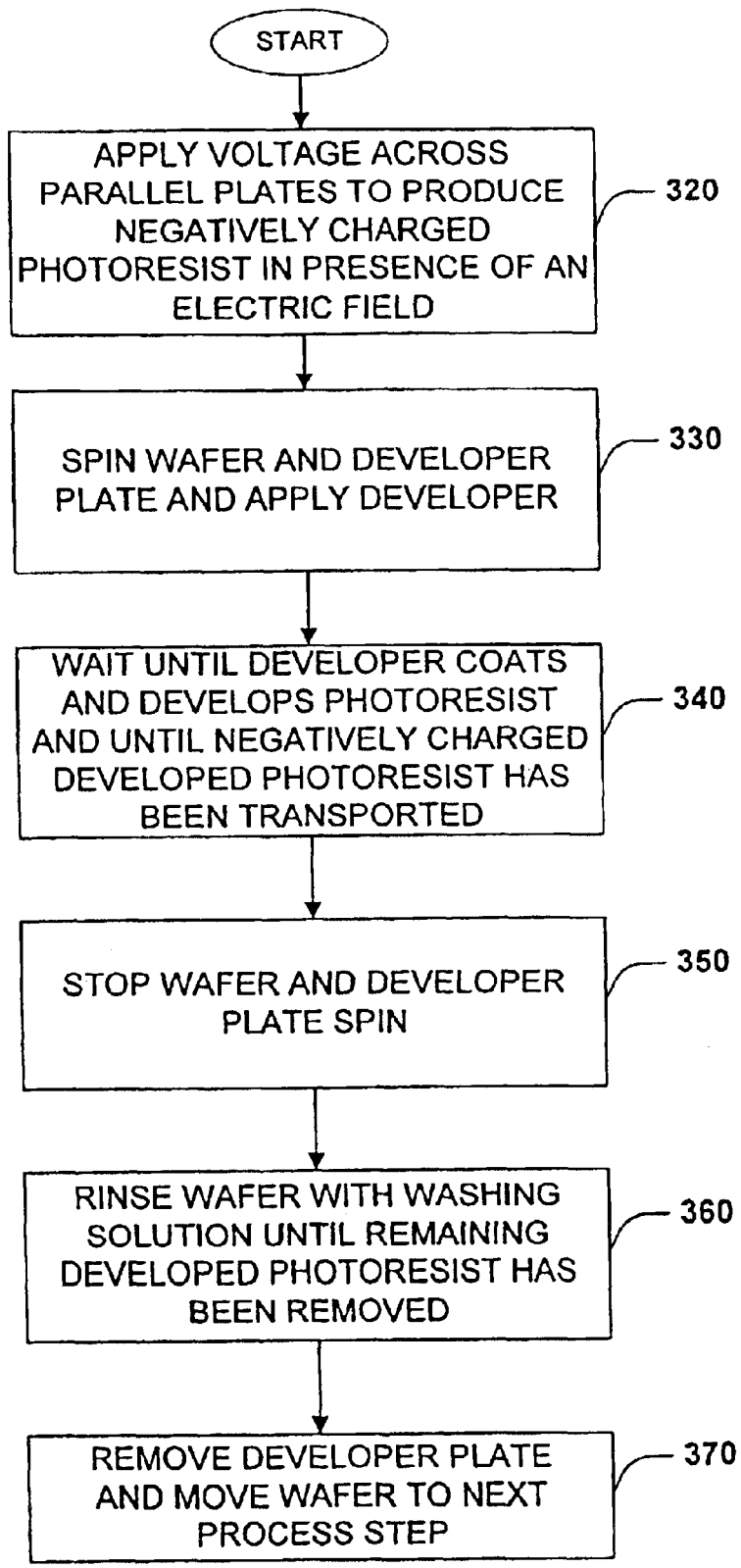
FIG. 9 is a flow diagram illustrating a specific methodology for carrying out a development process during the presence of an electric field between the developer plate and photoresist material layer in accordance with the present invention.

FIG. 9 is a flow diagram illustrating another methodology for carrying out the development process by employing a differential potential across the developer plate and the wafer in accordance with the present invention. In step 320, a differential voltage is applied across the developer plate 61 and the wafer 64 producing a negatively charged photoresist layer in the presence of an electric field. In step 330, the developer plate 61 and the wafer 64 are spun as developer is applied. In step 340, the process waits for the developer to coat and develop the photoresist material layer 62 and also until all of the negatively charged developed photoresist has been transported. In step 350, spinning of the developer plate 61 and the wafer 64 is stopped. The wafer is then rinsed with a washing solution material until the remaining developed photoresist has been removed in step 360. In step 370, the developer plate 61 is moved from the top of the wafer 64 and the wafer 64 is advanced to the next process.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for applying a material onto a photoresist material layer disposed on a substrate, the system comprising:
    a parallel plate having a generally planar surface that has a shape adapted to substantially surround the top surface of the photoresist material layer disposed on the substrate, the general planar surface having a plurality of apertures extending therethrough, the parallel plate being adapted to receive the material and apply the material onto the photoresist material layer through the plurality of apertures wherein the parallel plate is positioned above the photoresist material layer during application of the material forming a gap therebetween; and
    a voltage source operable to provide a differential voltage, the voltage source having a first terminal coupled to the parallel plate and a second terminal coupled to the substrate wherein a differential voltage is applied to the parallel plate and substrate providing an electric field in the gap.

2. The system of claim 1, wherein the material comprises a developer material.

3. The system of claim 1, wherein the material comprises a washing solution.

4. The system of claim 1, wherein the gap having a size from about 0.5 to about 5 mm.

5. The system of claim 1, wherein the parallel plate having the generally planar surface has a shape adapted to completely surround the top surface of the photoresist material layer.

6. The system of claim 1, further comprising a developer supply system, wherein the developer supply system further comprising at least one developer supply nozzle coupled to the parallel plate, the developer supply nozzle being adapted to supply the parallel plate with the material.

7. The system of claim 1, further comprising a rotating shaft coupled to the parallel plate, the rotating shaft being adapted to rotate the parallel plate during application of the material.

8. The system of claim 7, wherein the rotating shaft having a material supply tube extending therethrough, the material supply tube being adapted to supply the parallel plate with the material.

9. The system of claim 1, wherein the general planar surface having a generally circular shape with a circumference approximately equal to a circumference of the substrate.

10. The system of claim 1, wherein the differential voltage causes the photoresist material layer to retain a negative charge and the negatively charged photoresist material layer facilitates transport of developed portions of the photoresist material layer during a development process upon being exposed to the electric field in the gap.

11. A method for applying a material onto a photoresist material layer disposed on a substrate, the method comprising the steps of:
    providing a parallel plate having a generally planar surface that has a shape adapted to substantially surround the top surface of the photoresist material layer disposed on the substrate, the general planar surface having a plurality of apertures extending therethrough for applying a material onto the photoresist material layer;
    positioning the parallel plate above the photoresist material layer forming a gap therebetween;
    applying a differential voltage between the parallel plate and the photoresist material layer providing a electric field between the gap;
    supplying the parallel plate with the material;
    rotating the photoresist material disposed on the substrate and the parallel plate concurrently; and
    applying the material onto the photoresist material layer through the apertures until the photoresist material layer is covered by the material and until the developer develops the photoresist material layer.

12. The method of claim 11, wherein the material comprises a developer.

13. The method of claim 11, wherein the material comprises a washing solution.

14. The method of claim 11, wherein the gap having a size from about 0.5 to about 5 mm.

15. The method of claim 11, wherein the step of rotating the photoresist material disposed on the substrate and the parallel plate concurrently comprising rotating the photoresist material layer and the parallel plate in the same direction at the same speed.

16. The method of claim 11, wherein the step of rotating the photoresist material disposed on the substrate and the parallel plate concurrently comprising rotating the photoresist material layer in a direction opposite the parallel plate.

17. The method of claim 11, further comprising a step of negatively charging the photoresist material layer prior to the step of providing an electric field between the gap.

18. A system for applying a developer material onto a photoresist material layer disposed on a substrate, the system comprising:
    a developer plate having a generally planar surface that has a shape adapted to substantially surround the top surface of the photoresist material layer disposed on the substrate, the general planar surface having a plurality of apertures extending therethrough, the developer plate being adapted to receive the developer material and apply the developer material onto the photoresist material layer through the plurality of apertures wherein the developer plate is positioned above the photoresist material layer during application of the material forming a gap therebetween;
    a voltage source operable to provide a differential voltage, the voltage source having a first terminal coupled to the developer plate and a second terminal coupled to the substrate wherein a differential voltage is applied to the developer plate and substrate providing an electric field in the gap; and
    a developer supply system connected to the developer plate and a supply of developer material, the developer supply system being adapted to provide the developer plate with developer material.

19. The system of claim 18, wherein the developer supply system further comprising at least one developer supply nozzle coupled to the developer plate, the developer supply nozzle being adapted to supply the developer plate with the developer material.

20. The system of claim 18, wherein the generally planar further comprising a plurality of apertures extending therethrough for receiving a washing solution material and applying the washing solution material to the photoresist material layer.

21. The system of claim 20, further comprising at least one washing solution nozzle coupled to the developer plate, the washing solution nozzle being adapted to supply the developer plate with the washing solution material.

22. The system of claim 18, wherein the gap having a size from about 1 to about 3 mm.

23. The system of claim 18, further comprising a rotating shaft coupled to the developer plate, the rotating shaft being adapted to rotate the developer plate during application of the developer.

24. The system of claim 23, wherein the rotating shaft having a material supply tube extending therethrough, the material supply tube being coupled to the developer supply system and being adapted to supply the developer plate with the developer.

25. The system of claim 18, wherein the general planar surface having a generally circular shape with a circumference approximately equal to a circumference of the substrate.

26. The system of claim 18, the voltage source being further operable to negatively charge the photoresist material such that exposure to the electric field facilitates transport of developed portions of the photoresist material layer during a development process upon being exposed to the electric field in the gap.

27. A system for applying a material onto a photoresist material layer disposed on a substrate, the system comprising:
 a developer plate having a plurality of apertures extending therethrough, the developer plate being adapted to receive developer material and supply developer material onto the photoresist material layer through the apertures;
 means for providing an electric field between the developer plate and the photoresist material layer;
 means for supplying a developer material to the developer plate; and
 means for rotating at least one of the photoresist material layer and the developer plate during application of a developer material onto the photoresist material layer.

28. The system of claim 27, further comprising means for negatively charging the photoresist material layer.

* * * * *